Sept. 2, 1958 KIYO TOMIYASU 2,850,626

MICROWAVE MIXER HAVING SINGLE MIXER CRYSTAL AND HYBRID SYSTEM FOR BALANCING OUT OSCILLATOR NOISE

Filed March 28, 1955 2 Sheets-Sheet 1

INVENTOR

KIYO TOMIYASU

BY R. V. Craddock

ATTORNEY

INVENTOR
KIYO TOMIYASU
BY R. V. Craddock
ATTORNEY 2,850,626
Patented Sept. 2, 1958

2,850,626

MICROWAVE MIXER HAVING SINGLE MIXER CRYSTAL AND HYBRID SYSTEM FOR BALANCING OUT OSCILLATOR NOISE

Kiyo Tomiyasu, Flushing, N. Y., assignor to Sperry Rand Corporation, a corporation of Delaware Application March 28, 1955, Serial No. 497,328

12 Claims. (Cl. 250—20)

This invention relates to microwave mixer systems.

The output voltage of a local oscillator such as a reflex klystron includes a spectrum of small-amplitude noise voltages at different frequencies centered about a continuous sinusoidal output voltage of the klystron at the frequency to which the klystron is tuned. If 30 megacycle or 60 megacycle I.-F. amplifiers are used in a microwave receiver employing a klystron local oscillator, for example, two portions or frequency bands of the noise spectrum of the klystron are spacer on one side and the other, respectively, of the klystron local oscillator frequency by frequencies within the bandwidth of the I.-F. amplifiers. Noise energy over the aforementioned noise frequency bands can mix with the aforementioned sinusoidal output energy of the klystron at a mixer device for the system, thus providing undesirable intermediate frequency energy containing noise components.

It is possible to minimize the effects of the aforementioned noise energy by employing a mixer utilizing a pair of crystal rectifiers in a balanced circuit arrangement for cancelling noise components thereat. However, complete cancellation of the noise is not always feasible because of design problems such as obtaining a matched pair of crystals which do not become mismatched during operation. Also, in some receiver designs, single-ended mixers employing a single crystal rectifier are required. No good compensation for local oscillator noise in such a system as the latter has heretofore been realized.

It is an object of the present invention to provide a microwave system for delivering energy of a first frequency from a first source and energy of a second frequency from a second source to a common load while providing isolation between the two sources, the system including means for insuring that energy from the second source which may have a frequency corresponding to the aforementioned first frequency is effectively isolated from the load.

It is a further object of the present invention to provide an improved microwave mixer system wherein local oscillator noise energy of certain frequencies is effectively isolated from the mixer device of the system.

It is another object of the present invention to provide a microwave mixer system for reducing the effects of noise from a local oscillator even though only a single mixer device is employed with the system for providing intermediate frequency energy.

The foregoing and other objects and advantages of the present invention are obtained by utilizing first and second four-terminal microwave hybrid couplers each having one terminal coupled to a terminal of the other by first transmission line means of a first length and another terminal of one coupled to another terminal of the other by second transmission line means of a different length than the first. The remaining two terminals of the first hybrid coupler are adapted to be coupled, respectively, to means for supplying energy of first and second different frequencies. The remaining two terminals of the second hybrid coupler are adapted to be coupled to a mixer device and a non-reflecting termination, respectively. If the difference in the electrical lengths of the foregoing transmission line means is an integral number of wavelengths at one frequency and an odd number of half-wave lengths at the other frequency, depending on the particular type of hybrid couplers employed and arrangement of input terminals thereof, the aforementioned energy of different frequencies will be in the proper phase at the mixer terminal of the second hybrid coupler for exciting the mixer. If means are provided for equalizing the attenuation provided by both transmission line means, certain noise components of predetermined frequencies from a source such as a local oscillator of one of said different frequencies are effectively prevented from reaching the mixer device. The particular systems constructed in accordance with the present invention and their operation will become more apparent from the detailed description of the drawings, in which:

Fig. 1 is a schematic view of a first embodiment of the present invention;

Fig. 2*a* is a plot of voltage versus frequency at two of the output arms of the device of Fig. 1 with energy supplied to one of the input arms thereof;

Fig. 2*b* is a plot of voltage versus frequency at two of the output arms of the device of Fig. 1 with energy supplied to the other input arm thereof;

Figures 1, 2A, 2B, 3, 4, 5:
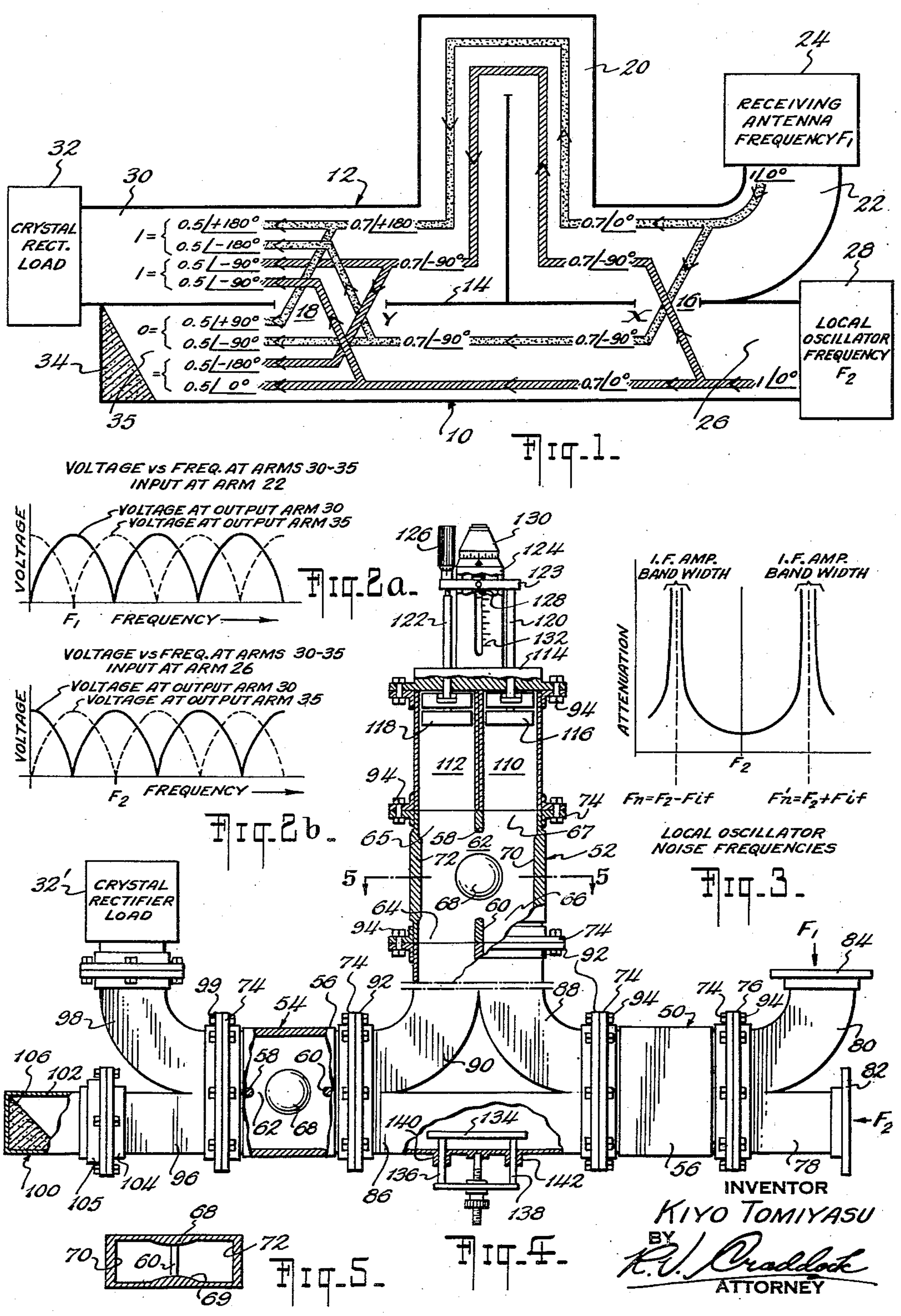
Fig. 3 is a graph for illustrating the attenuation of noise frequencies for each of the hybrid coupler arms of Figs. 1, 4, 6 and 8 terminated by a crystal rectifier terminal.
Fig. 4 is a view of a practical embodiment of the system shown in Fig. 1.
Fig. 5 is a sectional view along the line 5—5 of Fig. 4.

Referring to the schematic showing of Fig. 1, the numerals 10 and 12 indicate a pair of rectangular wave guides of similar cross section having a common narrow wall 14 therebetween. The two wave guides 10 and 12 are directionally coupled together at two separate points by suitable coupling slots in the common wall 14, the coupling slots being indicated at 16 and 18. Thus, the wave guides 10 and 12 and the coupling slots 16 and 18 define two directional couplers joined in tandem. The path length between the directional couplers along the wave guide 12 is made longer than the path length between the couplers along the wave guide 10 by virtue of a folded portion, indicated at 20, in the wave guide 12 intermediate the coupling slots 16 and 18.

An input arm 22 of the wave guide 12 is coupled to a carrier wave source 24 such as an antenna for receiving microwave energy having a frequency $F_1$. An input arm 26 of the wave guide 10 is coupled to a local oscillator source 28 such as a reflex klystron for delivering microwave energy having a frequency $F_2$. For best operations the wave guides 10 and 12 should be excited in a dominant TE mode wherein the electric vectors of the microwave energy are perpendicular to the broad walls of wave guides 10 and 12.

An output arm 30 of the wave guide 12 is coupled to a single-ended crystal rectifier load 32 such as a single crystal rectifier for mixing local oscillator and carrier wave energy. The output fom the load 32 may be supplied to an intermediate frequency amplifier, not shown, and thence to remaining components of a radar receiver, not shown. A non-reflecting energy absorbing termination 34 is provided in an output arm 35 of the wave guide 10.

The directional couplers 16 and 18 are each of a type which functions as a four-terminal hybrid coupler or junction, that is, which can be so dimensioned that power incident upon a terminal at one end is evenly divided and appears in equal quantities at both terminals at the other end of the directional coupler. A preferred directional coupler having the properties of a hybrid junction is described in the Proceedings of the I. R. E., February 1952, page 180. This type of directional coupler couples energy in the forward direction, and in addition, is electrically symmetrical in that a wave being coupled encounters the same electrical conditions on either side of the couple. One of the properties of such a directional coupler is that the phase of the coupled wave lags by 90° the phase of the direct wave at the output terminals of the coupler, so that a quadrature phase shift is effected between the two output signals derived from the directional coupler. In addition, there is a 45° phase lag of the direct wave due to the coupling slot.

Operation of the mixer system in its schematic form as shown in Fig. 1 will now be considered. The polar form of the electric vector of the energy at the two frequencies $F_1$ and $F_2$ at various points along the wave guides is shown in Fig. 1 to indicate the change in phase and amplitude which takes place. In the following analysis, the 45° phase lag of the direct wave due to the coupling slot in each of the hybrid couplers 16 and 18 is neglected since it produces no net effect in the operation of the system. The phase angles indicated are merely assigned values which indicate the relative phase of the various waves at common transverse planes through guides 10 and 12.

Energy at the frequency $F_2$ from the local oscillator source 28, indicated by the cross-hatched line in Fig. 1, is coupled to the wave guide 10 and on reaching the coupling slot 16 is divided equally between the wave guide 10 and the wave guide 12. By virtue of the power split at the coupling slot 16, the direct wave from the source 28 at the point X in the wave guide 10 has an electric vector having a reduced magnitude of .707 at an assigned phase of zero. (It should be noted that only an approximate figure of 0.7 is used to indicate the magnitude in the drawings.) The energy from the source 28 coupled into the wave guide 12, however, is both reduced in magnitude and shifted in phase by the coupling slot, so that the electrical vector at the point X in the wave guide 12 is .707 with a phase angle of −90° relative to the direct wave, due to the phase quadrature shift effected by the directional coupler as described above.

If the additional path length in the wave guide 12 introduced by the folded section 20 is equal to an integral number of guide wavelengths at the local oscillator frequency $F_2$, the phase relationship between the direct wave in the wave guide 10 and the coupled wave in the wave guide 12 will be the same at point Y as it is at point X, that is, there will be no relative phase shift between the direct and coupled waves. The energy of the direct wave is evenly split at the coupling slot 18 so that the electric vector of the wave continuing on down the wave guide 10 to the termination 34 is reduced in magnitude to 0.5 at the same assigned phase angle of zero. The electric vector of the wave coupled into wave guide 12 at the slot 18 is changed in both magnitude and phase by the coupling slot 12, so that it has a magnitude of 0.5 and a relative phase angle −90°, again as the result of the quadrature phase shift introduced by the directional coupler.

Similarly, the coupled wave from the source 28 in the wave guide 12 is evenly split at the coupling slot 18, the wave continuing directly on down the wave guide 12 to the crystal rectifier load 32 being reduced in magnitude to 0.5 at the assigned phase angle of −90°. The portion of the coupled wave in the wave guide 12 from the source 28 which is coupled back into the wave guide 10 is both reduced in magnitude to 0.5 and shifted in relative phase by −90°, so that it is equal in magnitude to the direct wave from the source 28 but 180° out of phase by virtue of the two 90° phase shifts at each of the coupling slots 16 and 18. Thus, the two waves of energy cancel each other in the region of the termination 34, while the two waves reinforce each other in the region of the crystal rectifier load 32.

In a similar manner, energy of frequency $F_1$ from the carrier wave source 24 is coupled to the input arm 22 of the wave guide 12. The coupling slot 16 effects an even energy split so that at the point X the electric vector of the direct wave of frequency $F_1$ in the wave guide 12 has a magnitude of .707 at zero phase angle while the coupled wave of frequency $F_1$ in the wave guide 10 has a magnitude of .707 at a phase angle of −90° relative to the direct wave.

Now assuming that the folded portion 20 of the wave guide 12 introduces an additional path length between the points X and Y of an odd number of guide half wavelengths at the carrier wave frequency $F_1$, the relative phase of the direct wave at the point Y will be shifted by a half wavelength or 180°, so that the electric vector at the point Y has a magnitude of .707 at a phase angle of +180°. This direct wave is split by the coupling slot 18, the direct portion continuing on to the crystal rectifier load 32 with a magnitude of 0.5 at an assigned phase angle of +180°. The wave coupled into the wave guide 10 is reduced in magnitude to 0.5 but with the phase angle shifted to 90° by virtue of the negative quadrature phase shift of the directional coupler 18.

The coupled wave from the carrier wave source 24 in the wave guide 10 is also split at the coupling slot 18, the direct portion continuing towards the termination 34 with a reduced magnitude of 0.5 with an assigned phase angle of −90°. Thus, the two portions of the energy at the carrier wave frequency $F_1$ in the arm 35 of wave guide 10 have the same magnitude but are 180° out of phase, so that they cancel each other.

The other portion of the coupled wave which is coupled back into the wave guide 12 has a magnitude of 0.5 but is shifted in phase by an additional −90°, giving it a phase angle −180° in the wave guide 12. Thus, the direct and coupled waves from the source 24 reinforce each other in the arm 30 of wave guide 12 and continue on to the load 32.

It will be seen from the above discussion that when the difference in path length between the points X and Y via the wave guides 10 and 12 is equal to an integral number of guide wavelengths at the local oscillator frequency $F_2$ and equal to an odd number of guide half wavelengths at the carrier wave frequency $F_1$, in-phase energy from source 28 and in-phase energy from source 24 is transmitted to the load 32 with substantially none of the energy reaching the termination 34. The local oscillator energy of frequency $F_2$ is beat or heterodyned with the carrier wave energy of frequency $F_1$ by the crystal rectifier 32 so as to provide an intermediate frequency output.

The conditions necessary to effect diplexing in the manner above described may be expressed mathematically as:

$$\Delta l = m\lambda g_2 \quad (1)$$

and $$\Delta l = (n \pm 1/2)\lambda g_1 \quad (2)$$

where $\Delta l$ is the physical difference in path lengths between the points X and Y via the two wave guides 10 and 12, $\lambda g$, and $\lambda g_2$ are the guide wavelengths at the two frequencies $F_1$ and $F_2$, respectively, and $m$ and $n$ are integers. If a mixer system as shown in Fig. 1 is designed as aforedescribed, the voltage outputs in wave guide arms 30 and 35 for carrier wave energy from source 24 at frequencies above cut-off for wave guides 10 and 12 or for local oscillator energy from source 28 at the same frequencies, have periodic waveforms versus frequency as is illustrated in Fig. 2*a* and Fig. 2*b*, respectively. Corresponding points on the frequency axes of Fig. 2*a* and Fig. 2*b* are representative of the same frequencies. The frequencies $F_1$ and $F_2$ of energy from sources 24 and 28, respectively, are specifically indicated in Figs. 2*a* and 2*b*, respectively, so that it can be readily seen that when the energy at the input arm 22 of Fig. 1 has a frequency $F_1$ and the energy at the input arm 26 has a frequency $F_2$, maximum energy at both of these frequencies is provided at the output arm 30 for mixing at the crystal rectifier load 32.

In a reflex klystron local oscillator, for example, it is known that the output voltage therefrom includes a spectrum of small amplitude noise voltages centered about the continuous sinusoidal output signal voltage of the tube. The principal advantage of the microwave mixer system as aforedescribed and illustrated in Fig. 1 is that it prevents local oscillator noise voltages over frequency bands on one and the other side of the local oscillator frequency $F_2$ from reaching the crystal rectifier load 32 in output arm 30 where it could otherwise beat against the local oscillator signal energy so as to provide beat frequencies within the bandwidth of an I. F. amplifier, not shown, coupled to the rectifier 32. This is illustrated in Fig. 3, where attenuation versus frequency of noise energy in arm 30 derived from the local oscillator source 28 is plotted. The frequency points along the abscissa of Fig. 3 have the same frequency values as the corresponding points along the abscissas in Figs. 2*a* and 2*b*.

As is seen in Fig. 3, infinite attenuation is provided for noise energy from local oscillator source 28 at a frequency $F_n$ corresponding to the carrier wave frequency $F_1$ and displaced on one side of frequency $F_2$ by an intermediate frequency $F_{I.\ F.}$ Likewise, infinite attenuation is provided for noise energy from the local oscillator source 28 at a frequency $F'_n$, the frequency $F'_n$ being above the local oscillator frequency by the frequency $F_{I.\ F.}$ Suitable attenuation is provided for noise energy at frequencies over a lower noise bandwidth including $F_n$ as its center and an upper noise bandwidth including $F'_n$ as its center. The foregoing bandwidths may correspond to bandwidths of the order of 1.8 megacycles, for example, a typical bandwidth for an I. F. amplifier, not shown, to be coupled to the crystal rectifier 32. Thus, noise energy from local oscillator source 28 having a frequency which could beat with the local oscillator energy of frequency $F_2$ to provide intermediate frequency energy acceptable to an I. F. amplifier is suitably attenuated effectively without substantially reducing the local oscillator energy at frequency $F_2$ nor carrier wave energy at frequency $F_1$. Thus, a reduction in the noise level of a radar receiver in which the aforedescribed components may be employed is effected.

The closer together the two frequencies $F_1$ and $F_2$ are, the greater $\Delta l$ in Equations 1 and 2 must be for proper diplexing to be effected. Since $F_2$ and $F_1$ comprise local oscillator and carrier wave frequencies, respectively, which are usually close together, it would generally be desirable to make $\Delta l$ as small as possible. The following equation should be satisfied for a minimum physical difference in the path lengths between the points X and Y via the transmission paths along the two wave guides 10 and 12 in Fig. 1:

$$\Delta l=\frac{C}{2\Delta F}\left[1-\left(\frac{\bar{\lambda}}{\lambda_c}\right)^2\right]^{1/2} \qquad (3)$$

where C is the velocity of light in free space, $\Delta F$ is the difference between the frequencies $F_1$ and $F_2$, $\bar{\lambda}$ is substantially the mean free space wavelength for the frequencies $F_1$ and $F_2$, and $\bar{\lambda}_c$ is the cut-off wavelength of the wave guides 10 and 12. The difference $\Delta l$ might be in the region of 200 cm. for a $\Delta F$ of 60 megacycles for a device as aforedescribed constructed for use in the 9 kmc. (kilomegacycle) region, for example.

In the description of Fig. 1 above it is assumed that there is no difference in attenuation of the energy of frequencies $F_1$ and $F_2$ when travelling along the wave guides 10 and 12. For a case where the frequencies $F_1$ and $F_2$ are close together as when they comprise carrier wave and local oscillator frequencies, the folded portion 20 of wave guide 12 between the couplers 16 and 18 is required to be very much longer than the portion of wave guide 10 between couplers 16 and 18, even though Equation 3 is satisfied. Therefore, wave guide 12 would provide greater attenuation for energy travelling from coupler 16 to coupler 18 than wave guide 10. Thus, an adjustable attenuator should be provided in wave guide 10 between couplers 16 and 18 for equalizing the attenuation of energy between couplers 16 and 18 in the two wave guides 10 and 12. Hence, the two portions of noise energy at the input of wave guide arm 30 from wave guides 10 and 12 can be caused to have equal magnitudes so as to provide for complete cancellation and substantially infinite attenuation in the output arm 30 for local oscillator noise components at the noise frequencies $F_n$ and $F'_n$.

Furthermore, in a practical embodiment of the system of Fig. 1, means for adjusting the relative electrical lengths of wave guide 10 and path 20 should be provided. This would be desired as Equations 1–3 for $\Delta l$ are predicated on the assumption that the guide wavelength all along each of wave guides 10 and 12 is constant. However, the presence of a wave guide bend or other discontinuity such as an attenuator as described above would cause a guide wavelength to change at various regions therealong. Therefore, even if the physical difference $\Delta l$ in the lengths of the wave guides is chosen in accordance with Equations 1–3, a slight adjustment in the electrical length of one of the guides may be necessary to optimize the transfer of energy at frequencies $F_1$ and $F_2$ to the crystal rectifier load 32.

A practical embodiment for the system of Fig. 1 which includes an adjustable attenuator in a wave guide arm corresponding to the portion of wave guide 10 between couplers 16 and 18 in Fig. 1 and a phase shifter comprising a pair of wave guide arms corresponding to the two adjacent arm portions of the folded section 20 of Fig. 1 with a hybrid coupler 52 for joining the two arm portions is illustrated in Fig. 4.

Referring to Fig. 4, the numerals 50, 52 and 54 indicate generally three identical hybrid couplers similar to couplers 16 and 18 of Fig. 1, each of which is cast as a single unit including a hollow rectangular pipe section 56 with septums 58 and 60 extending between the broad walls to form coupling slots 62 and four wave guide terminals indicated at 64, 65, 66 and 67 (the reference numerals for such terminals only being shown for the coupler 52). Spherical segments 68 and 69 of each of the aforementioned hybrid couplers, as is shown more clearly in Fig. 5, project into the interior of the couplers and are symmetrically positioned at the centers of the coupling slots 62. These spherical segments, together with the reduced cross section provided by the thickened wall portions 70 and 72, of the pipes 56, improve the isolation and bandwidth characteristics of the couplers. Flanges 74 are provided at each end of each of the aforementioned hybrid couplers for coupling to suitable wave guide arms.

Connected to one end of the hybrid coupler 50, by means of the flanges 74 and 76, are input wave guide arms 78 and 80, the latter being in the form of an H-plane bend. Wave guide arms 78 and 80 correspond to the input arms 26 and 22, respectively, of Fig. 1. Flanges 82 and 84 provide coupling means for connecting the input wave guide arms 78 and 80 to wave guide transmission systems for supplying dominant TE mode energy at the local oscillator frequency $F_2$ and dominant energy TE mode at the carrier wave frequency $F_1$ to input wave guide arms 78 and 80, respectively.

Two terminals of the hybrid directional couplers 50 and 54 corresponding to the couplers 16 and 18 of Fig. 1, respectively, are directly connected by a section of rectangular wave guide 86. Two other terminals of the couplers 50 and 52 are coupled to one pair of ends of two wave guides 88 and 90 each having a wave guide bend adjacent each of the aforementioned pair of ends. The other pair of ends of the wave guides 88 and 90 are coupled to a pair of terminals 66 and 64 of hybrid coupler 52. The wave guides 88 and 90 extend from the curved portions or bends thereof in the direction of coupler 52 for a relative distance much larger than any shown, so are illustrated in Fig. 4 as broken at intermediate portions therein. Suitable flanges, indicated at 92, are provided for joining the wave guide sections 88 and 90 to the hybrid couplers 50, 54 and 52. Suitable means, such as bolts 94, may be used to secure the flanges together.

The outputs from the two output terminals of hybrid coupler 54 are supplied to wave guide arms 96 and 98, the latter being an H-plane bend. The output wave guide sections 96 and 98, which correspond to arms 35 and 30 of Fig. 1, respectively, are secured to the hybrid coupler 54 by means of a flange 99 secured to the flange 74 of the coupler. A non-reflecting termination for the wave guide 96, indicated generally at 100, includes a section of wave guide 102 secured to the wave guide section 96 by means of coupling flanges 104 and 105. Energy absorbing material, such as Polyiron or the like indicated at 106, is inserted in the wave guide 102 to provide a non-reflecting energy absorbing termination.

Adjustable short circuit terminations including a pair of rectangular wave guide sections 110 and 112 coupled at one of their ends to the terminals 65 and 67, respectively, of hybrid coupler 52 are also provided in the embodiment of Fig. 4. The coupler 52 and adjustable wave guide sections 110 and 112 provide an adjustable phase shifter as described in copending application No. 360,327, filed June 8, 1953, in the name of Kiyo Tomiyasu. The other end of the wave guide sections 110 and 112 are terminated in a cap 114. Short circuits are provided by plungers or pistons within the wave guides 110 and 112, the plungers being indicated at 116 and 118 respectively. The plungers are separated from the walls of the wave guides to form a wave trap type of short circuit, such as described in Patent No. 2,503,256 to E. L. Ginzton.

The plungers are secured to the lower ends of parallel rods 120 and 122, which extend through holes in the cap 114. The upper end of the rod 120 is secured to a yoke 123 which is slidably supported in slots provided in the guide member 124. The upper end of the rod 122 is adjustably secured to the yoke 123 by means of a micrometer type of adjusting element, indicated at 126, which provides for relative adjustment of the two plungers 116 and 118.

The yoke 123 is positioned along the guide member 124 for varying the position of the short-circuiting plungers 116 and 118 by means of a micrometer screw 128 which threadedly engages the yoke 123. A calibrated dial 130 on the end of the micrometer screw together with a linear scale 132 provides means for positioning the short-circuiting plungers 116 and 118 at any predetermined positions within the wave-guides 110 and 112 respectively. Adjustment of the plungers 116 and 118 causes the electrical length of the path for energy which travels from the coupler 50 to the coupler 54 via wave guides 88, 90 and coupler 52 to change in accordance with the principles set forth in the aforementioned copending application No. 360,327.

An adjustable wave guide attenuator comprising a lossy vane 134 of resistive material for microwaves is positioned along the wave guide portion 86 between the hybrid couplers 50 and 54. The vane 134, which may have tapered ends for minimizing the impedance discontinuity provided thereby, is supported in the plane of the electric vector for microwave energy in wave guide 86 by struts 136 and 138 supported for displacement within bearings 140 and 142 in a narrow side wall of wave guide 86. When the vane 134 is at the center of the wave guide 86 where the electric field therein is most intense, maximum attenuation of energy is provided. In contrast, when the vane 134 is moved close to the narrow side wall of wave guide 86, where the electric field is negligible, the attentuation is a minimum. Any such attenuator, which is conventional in the art, may be employed.

For the device of Fig. 4, the expression $\Delta l$ of Equations 1–3 is the difference between the physical length of the transmission path between couplers 50 and 54 along wave guide 86 and the physical length of the transmission path between couplers 50 and 54 along wave guide 88, through coupling slot 62, and along wave guide 90. With the frequencies $F_1$ and $F_2$ and the intermediate frequency difference therebetween having predetermined values, a minimum $\Delta l$ for the device of Fig. 4 is determined from Equation 3 so that the lengths of the wave guide sections of Fig. 4 can be designed in accordance therewith.

After calculation of $\Delta l$ for the device of Fig. 4 as above and construction of the Fig. 4 system in accordance therewith, the plungers 116 and 118 are adjusted slightly by micrometer screw 128 (up to approximately $\pm 1$ cm. for frequencies in the 9 kmc. region) until a maximum amount of energy of frequency $F_2$ from a local oscillator coupled to wave guide arm 78 reaches the crystal rectifier load 32'. The foregoing adjustment is effected with the attenuator vane 134 being in a position closely adjacent the narrow wave guide wall upon which it is supported for minimum attenuation thereby. Any suitable means, not shown, may be employed for measuring the energy at the load 32'.

Next, the plungers 116 and 118 are adjusted (up to approximately $\pm 5$ cm.) until energy of frequency $F_2$ is minimized at the crystal rectifier load 32'. Then, the attenuator vane 134 is moved into the interior of wave guide 86 until an even better null of energy at the frequency $F_2$ is provided at the crystal rectifier load 32'.

After the foregoing adjustment of the attenuator 134, the plungers 116 and 118 are again readjusted by a very slight amount to again obtain an even better null than before of energy of frequency $F_2$ at load 32'. Then, attenuator 134 is again adjusted to obtain what comprises substantially an optimum energy null for frequency $F_2$ at load 32', after which plungers 116 and 118 are readjusted until a maximum amount of energy of frequency $F_2$ supplied to wave guide arm 78 is provided at the crystal rectifier load 32'. If the foregoing procedure is followed, maximum amounts of energy of both frequencies $F_1$ and $F_2$ from a carrier wave source coupled to wave guide arm 80 and a local oscillator energy source coupled to wave guide arm 78 will reach the load 32' while substantially infinite attenuation of undesirable noise frequencies $F_n$ and $F'_n$ from the local oscillator will be effected.

Figure 6:
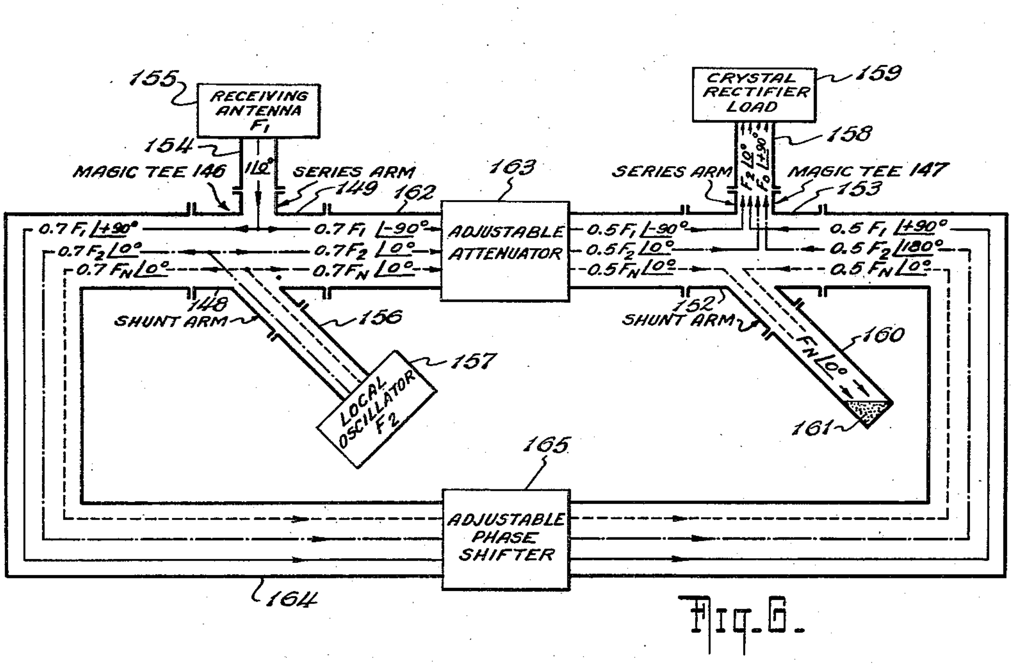
Fig. 6 is a schematic view of a further embodiment of the present invention utilizing magic tee hybrid couplers.
Figures 7, 8, 9:
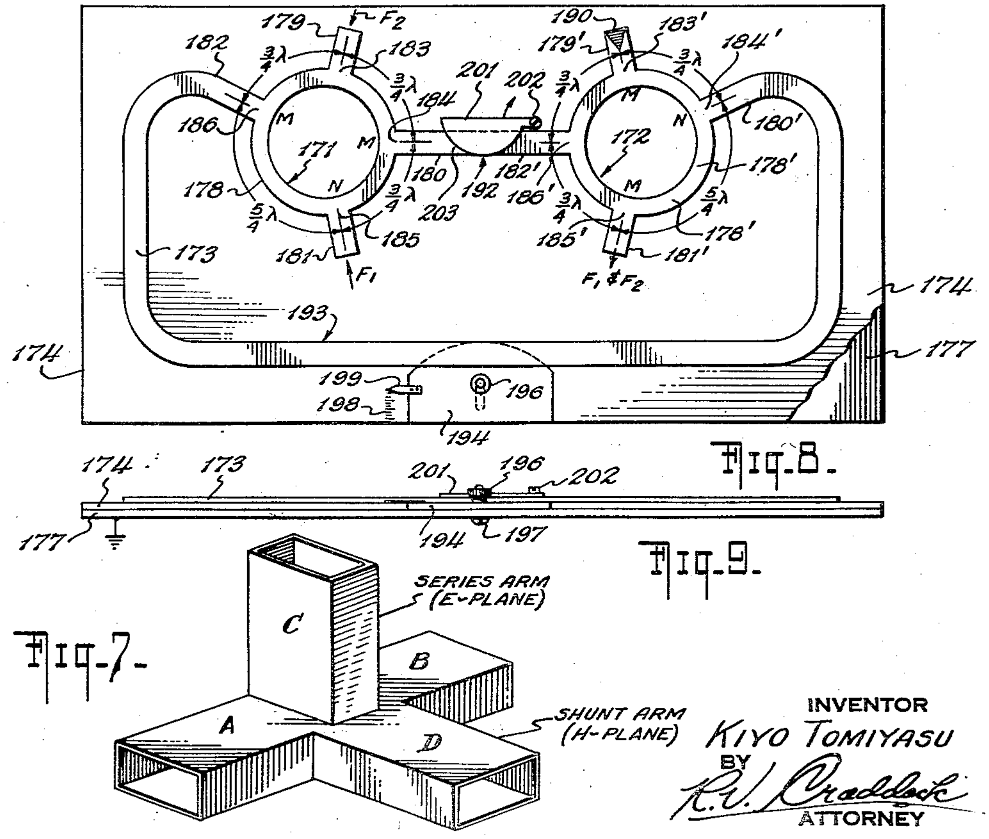
Fig. 7 is a perspective view of a magic tee hybrid coupler employing rectangular wave guides.
Fig. 8 is a view of another embodiment of the present invention utilizing hybrid ring coupler formed by strip transmission line sections.
Fig. 9 is an edge view of the device of Fig. 8.

An alternative embodiment of the invention employing a pair of identical wave guide magic tee hybrid couplers 146 and 147 is illustrated in Fig. 6. These couplers may be of the rectangular wave guide type as is illustrated in Fig. 7, for example. In Fig. 7, a main rectangular wave guide of the coupler is shown as comprising arms A and B. A series arm (E-plane) rectangular wave guide C and a shunt arm (H-plane) rectangular wave guide D are coupled to the junction of wave guide arms A and B. The four rectangular wave guide arms A—C have the same cross section and characteristic impedance, the arms A and B having equal lengths on opposite sides of a symmetrical transverse plane through arms C and D perpendicular to the axis of wave guide A—B.

If a matched source of energy is coupled to wave guide arm C of Fig. 7 for supplying this arm with electromagnetic energy in a dominant TE mode where the electric vector is perpendicular to the broad walls thereof, and the arms A, B and D are properly terminated with matched impedances, the energy from arm C at the wave guide junction will divide equally between arms A and B and excited these arms with equal voltages which are out of phase by 180°. The shunt arm D cannot be excited for the above mentioned case and no energy will reach the matched load therein.

If a matched source of energy is coupled to the shunt wave guide arm D of Fig. 7 for supplying this arm with the same type of dominant mode electromagnetic energy mentioned above, the energy will divide between the arms A and B and excite these arms with equal voltages of the same phase. The series arm C will not be excited for this case.

If wave guide arms C and D are properly terminated by matched loads, and dominant TE mode energy is supplied to the arms A and B so that equal voltages of opposite phase appear at the junction of the four arms A—C, the arm C will be excited so that energy will reach the load therein, but, there will be no excitation of the shunt arm D. Contrarily, if the aforementioned equal voltages are in phase at the junction of the arms A—C, the shunt arm D will become excited without excitation of the series arm C. The specific reasons for the general principles of operation for a magic tee device as shown in Fig. 7 need not be set forth as they are well known in the microwave art.

Referring again to Fig. 6, the magic tee couplers 146 and 147 are identical to the magic tee shown in Fig. 7, for example, the series and shunt arms for the couplers in Fig. 6 being designated as such in the drawing. Arms 148 and 149 of the magic tee 146 correspond to arms A and B, respectively, of the magic tee shown in Fig. 7. Likewise, arms 152, 153 of the magic tee 147 correspond to arms A and B of the Fig. 7 device.

An end terminal of the series arm of the magic tee 146 is connected by suitable coupling flanges to a rectangular wave guide 154 coupled to an antenna 155 for receiving carrier wave energy at a frequency $F_1$. An end terminal of the shunt arm of magic tee 146 is connected by suitable coupling flanges to a rectangular wave guide 156 coupled to a local oscillator 157 such as a reflex klystron source of microwave energy at the frequency $F_2$.

An end terminal of the series arm of the magic tee 147 is connected by suitable coupling flanges to a rectangular wave guide 158 terminated by a crystal rectifier mixer 159, the mixer 159 comprising a single crystal device, for example. An end terminal of the shunt arm of the magic tee 147 is connected by suitable coupling flanges to a rectangular wave guide 160 including a non-reflecting microwave energy absorptive termination 161.

The two adjacent terminals of wave guide arms 149 and 152 of the magic tees 146 and 147, respectively, are coupled together by suitable coupling flanges and a rectangular wave guide transmission line means 162 for example. An adjustable microwave attenuator 163 is included within the wave guide 162. Attenuator 163 may be of the same type as attenuator 134 of Fig. 4, for example, and is provided for substantially the same reasons as before.

A second rectangular wave guide transmission line means 164 of greater length than transmission means 162 is coupled between suitable coupling flanges at the end terminals of wave guide arms 148 and 153 of the magic tee couplers 146 and 147, respectively. An adjustable phase shifter 165 such as the type shown in Fig. 8.51 of the book entitled "Microwave Transmission Circuits," vol. 9 of the M. I. T. Radiation Laboratory Series, copyright, 1948, by McGraw-Hill Book Company, Inc., is employed in the wave guide 164 for changing its effective electrical length and optimizing the operation of the system of Fig. 6 just as in that of Fig. 4. The lengths of the transmission lines 162 and 164 should differ by an odd integral number of guide half wavelengths at the frequency $F_2$ of the local oscillator 157 and by an integral number of wavelengths at the frequency $F_1$ of the carrier wave energy received by antenna 155.

In operation of the system shown in Fig. 6, carrier wave energy of frequency $F_1$ enters the series arm of the magic tee 146 and divides equally between the arms 148 and 149, equal voltages of opposite phase being established in arms 148 and 149 as is illustrated in Fig. 6. The polar form of the electric vector of the energy at various points in the system of Fig. 6 is shown to indicate the change in phase and amplitude which takes place. The energy portions of frequency $F_1$ from the junction of magic tee 146 follow the solid line paths through the wave guide transmission lines 162 and 164 as is shown in Fig. 6. If the difference in electrical lengths of wave guide transmission lines 162 and 164 is made to be an integral number of wavelengths at the frequency $F_1$, the energy portions at the input terminals of arms 152 and 153 of the magic tee 147 are still out of phase by 180° as is indicated in Fig. 6. Thus, microwave energy portions of frequency $F_1$ from the receiving antenna 154 will be in the proper phase at the junction of magic tee 147 to excite the series arm thereof and supply in-phase carrier frequency energy to the crystal rectifier load 159. Since the aforementioned energy portions are 180° out of phase at the junction for magic tee 147, the shunt arm of the magic tee 147 is not excited, provided attenuator 163 was properly adjusted to equalize the two voltages of frequency $F_1$ supplied to the two input terminals of magic tee 147.

The energy from local oscillator 157 supplied to the input terminal of the shunt arm of magic tee 146 divides equally at the magic tee junction to establish voltages of equal magnitude and the same phase at the inputs for the transmission lines 162 and 164, energy of frequency $F_2$ from oscillator 157 following the dash-dot paths in Fig. 6. Since the lengths of transmission lines 162 and 164 differ by an integral number of guide half wavelengths at the local oscillator frequency $F_2$, the microwave energy portions of frequency $F_2$ supplied to the input terminals of the wave guide arms 152 and 153 of the magic tee 147 are caused to be out of phase by 180°. Thus, the series arm of the magic tee 147 will also be excited by in-phase portions of the local oscillator energy of frequency $F_2$ and substantially no energy at the local oscillator frequency is supplied to the termination 161 in the shunt arm of magic tee 147.

Any noise energy generated by the local oscillator 157 which has a frequency $F_n$ displaced from the local oscillator frequency $F_2$ by an intermediate frequency difference between the frequencies $F_1$ and $F_2$ will be supplied as equal voltages of the same phase to the input terminals of the wave guide transmission lines 162 and 164. The noise energy follows the paths indicated by the short dashes in Fig. 6. Since the transmission lines 162 and 164 differ in length by an integral number of wavelengths at the frequency $F_1$, noise energy portions of a frequency $F_n=F_1$ reaching the input terminals of the arms 152 and 153 of the magic tee 147 will still be in phase with each other as is indicated in Fig. 6. Since this is the case, the noise voltage components of frequency $F_n$ at the input terminals of the magic tee 147 do not have an optimum phase relationship for exciting the series arm of the magic tee 147, but, do have an optimum phase relationship for exciting the shunt arm thereof. Thus, most of the noise energy of frequency $F_n=F_1$ is absorbed in the termination 161. If attenuator 163 is properly adjusted so that noise energy portions at the input terminals of magic tee 147 are of equal magnitude, and such portions are in phase with each other at the junction of magic tee 147, substantially none of this energy will reach the crystal rectifier 159 at the end of the series arm of magic tee 147.

The system of Fig. 6 also functions similarly to that of Figs. 1 and 4 so that components of noise energy at a frequency $F'_n$ above the local oscillator frequency $F_2$ by the intermediate frequency between $F_1$ and $F_2$ will be in the wrong phase relationship at the input terminals of the arms 152 and 153 of the magic tee 147 to reach the crystal rectifier load 159. It has been found that noise energy over a band of noise frequencies below and above the local oscillator frequency $F_2$ will be attenuated as far as the series arm of the magic tee 147 is concerned and follow the attenuation curves of Fig. 3. Thus, noise energy over predetermined undesirable frequency bands having a width equal to the frequency band of an intermediate frequency amplifier is prevented from reaching the crystal rectifier 159.

Another embodiment of the present invention utilizing a pair of four-terminal microwave hybrid ring couplers 171 and 172 is shown in Fig. 8. The hybrid ring couplers 171 and 172 are part of a special configuration as shown in Fig. 8 comprised of a narrow ribbon-like conductor 173 cut from a sheet, for example, and supported upon a flat face of a dielectric member 174. Member 174 is supported upon a flat metallic sheet 177 as shown in Fig. 9, sheet 177 being grounded. Any section of the ribbon-like conductor 173 together with sheet 177 and the dielectric member 174 therebetween form what is known in the art as a microwave strip transmission line for transmission in a mode corresponding somewhat to transverse electromagnetic (TEM) mode propagation. The particular construction of a strip transmission line and theory of operation is set forth in articles on pages 1644–1663 of the "Proceedings of the I. R. E.," December 1952, for example.

The hybrid ring coupler 171 is comprised of ring strip 178 having an electrical length therearound of 3½λ, where λ is a strip transmission line wavelength for a mean frequency between two frequencies $F_1$ and $F_2$. Four strip arms 179–182 are coupled to ring strip 178 at four terminals 183–186, respectively. The terminals 186 and 184 are equally spaced around the ring strip 178 from terminal 183 by substantially ¾λ. The terminal 185 is spaced from terminal 184 by ¾λ and from terminal 186 by 5⁄4λ. The strip arms 179–182 comprise shunt (H-plane) arms for the hybrid ring 171, and should be slightly wider than the ring strip 178 for impedance matching purposes. The hybrid ring coupler 172 is substantially the same as hybrid coupler 171, the primed reference numerals for ring coupler 172 designating parts which correspond to those of coupler 171. A difference in the coupler 172 resides in the fact that the terminal 185' for the strip arm 181' is spaced from the terminal 186' by ¾λ and from terminal 184' by 5⁄4λ rather than vice versa as in the ring coupler 171.

A source of local oscillator frequency $F_2$, not shown, is adapted to be coupled by means such as a coaxial transmission line, not shown, to the strip arm 179 of the hybrid ring circuit 171. Similarly, a source of carrier wave frequency $F_1$, not shown, is adapted to be coupled by means such as a coaxial transmission line, not shown, to the strip arm 181. Suitable means for coupling coaxial transmission lines to strip lines are illustrated in Figs. 8 and 9 on page 1661 of the aforementioned December 1952 I. R. E. publication, for example.

A crystal rectifier mixer, not shown, is adapted to be coupled to strip arm 181' of the hybrid ring coupler 172 in a manner illustrated in Fig. 13 on page 1662 of the aforementioned I. R. E. publication for receiving energy of frequencies $F_1$ and $F_2$. The strip arm 179' of ring coupler 172 is terminated by coating an end section thereof with a lossy dielectric 190 such as graphited paint for providing a non-reflecting termination for arm 179' of ring circuit 172. The lossy dielectric 190 should be tapered as illustrated for obtaining a proper impedance match.

The arms 180 and 182' of the ring couplers 171 and 172, respectively, are joined so as to provide first transmission line means 192 for coupling the ring circuits 171 and 172 together at two of their terminals 184 and 186', respectively. The arms 182 and 180' of the ring couplers 171 and 172 are also joined so as to provide second transmission line means 193 for coupling together another pair of terminals 186 and 184' of the ring circuits 171 and 172, respectively.

The transmission lines 192 and 193 of Fig. 8 should differ in electrical length by an integral number of strip guide wavelengths at the frequency $F_1$ and by an odd integral number of strip guide half wavelengths at the frequency $F_2$. The electrical length of the strip transmission line 193 is made adjustable by providing a cut-out portion 194 of the shape shown in Fig. 8 from the dielectric element 174 so that an adjustable amount of dielectric can be provided between the wide surface of strip conductor 193 and the ground-plane conductor 177. A nut 196 and a bolt 197 are provided for clamping the element 194 against the plate conductor 177 to hold the element 194 in place in a desired position. An indicator 198 and a pointer 199 may be provided in conjunction with element 194 for indicating its position relative to the strip conductor 174.

A curved vane 201 of glossy material is rotatable about a pivot 202 provided on the dielectric element 174 so that a wide side of the vane 201 is opposite and closely adjacent a portion of the strip transmission line 192 for changing the attenuation along this line. A narrow edge 203 of vane 201 is curved as indicated for minimizing the impedance discontinuity along strip transmission line 192.

In the operation of the system of Fig. 8, carrier wave energy of frequency $F_1$ supplied to the strip arm 181 of ring coupler 171 divides equally at terminal 185 into two waves which are in phase as they leave terminal 185 and which proceed therefrom in clockwise and counterclockwise directions around ring strip 178. In view of the fact that ring strip 178 is 3½λ long at a mean frequency between $F_1$ and $F_2$, the aforementioned waves travelling therearound cause voltage maximums of opposite phase to occur at terminals 186 and 184 and a voltage minimum to occur at terminal 183. Since the strip arms 182 and 180 are shunt (H-plane) coupling arms they will be excited with equal voltages which differ in phase by 180° from each other.

The wave energy derived by the strip arms 182 and 180 from the terminals 186 and 184, respectively, travels over the transmission line means 193 and 192 to the input terminals 184' and 186', respectively, of ring coupler 172. Since the lines 192 and 193 differ in length by an integral number of wavelengths at frequency $F_1$, the wave energy portions at terminals 186' and 184' are still 180° out of phase with each other. In view of this fact and the fact that the terminal 185' of ring strip 178' is located as shown in Fig. 8, conditions are established whereby a voltage maximum exists at the terminal 185' at the frequency $F_1$ for maximum transfer of energy to the shunt (H-plane) arm 181' and to the crystal mixer, not shown, coupled thereto.

Input local oscillator energy of frequency $F_2$ supplied to the strip arm 179 divides equally at terminal 183 into two waves which are in phase as they leave terminal 183 and which proceed therefrom in clockwise and counterclockwise directions, around ring strip 178. Excitation of the ring strip 178 at terminal 183 and the clockwise and counterclockwise waves travelling therearound cause voltage maximums of the same phase to occur at the terminals 186 and 184. Since the strip transmission lines 193 and 192 differ in electrical length by an odd integral number of half wavelengths at the frequency $F_2$, the wave portions of the local oscillator energy derived from terminals 186 and 184 and supplied to input terminals 184' and 186' of the ring coupler 172 are caused to be 180° out of phase with each other. Thus, conditions are established for causing a voltage maximum at the frequency $F_2$ to be provided at terminal 185' of ring coupler 172 for transmission along arm 181' to the crystal rectifier, not shown, terminating this arm.

If local oscillator noise energy of a frequency $F_n$ corresponding to the carrier wave frequency $F_1$ spaced below $F_2$ by an intermediate frequency $F_{i.f.}$ is also received at the input terminals 183 of the ring coupler 171, in-phase voltage maximums for such energy will be established at output terminals 184 and 186 of ring coupler 171 for exciting the two strip transmission lines 192 and 193 with equal in-phase voltages. However, since the lengths of the transmission lines 192 and 193 differ by an integral number of wavelengths at the frequency $F_1=F_n$, the noise wave portions at the input terminals 184' and 186' of the ring coupler 172 are still in phase with each other. Proper adjustment of the vane attenuator 201 will cause these wave portions to be of equal magnitude. Since this is the case, conditions are established at the hybrid ring coupler 172 for a voltage minimum at frequency $F_n$ to be established at the terminal 185' so that no noise energy of frequency $F_n=F_1$ is supplied to the output arm 181' of coupler 172. The foregoing will also be the case for noise energy $F'_n$ spaced above the frequency $F_2$ by an intermediate frequency $F_{i.f.}$ Generally, a plot of the attenuation of local oscillator noise energy for the output arm 181' of the hybrid coupler 172 will also follow the curves of Fig. 3 as for the other systems described herein.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A microwave system, comprising first and second microwave hybrid couplers, each of said couplers having a pair of input terminals and a pair of output terminals, means coupled to respective ones of the input terminals of said first coupler, respectively, for supplying microwave energy of a first frequency and microwave energy of a second frequency thereto, means coupling respective ones of the pair of output terminals of said first hybrid coupler to respective ones of the pair of input terminals of said second hybrid coupler, a mixer device coupled to one of the output terminals of said second coupler, said hybrid couplers and the coupling means therebetween comprising means for supplying energy of said first and second frequencies to said mixer device whereat portions of energy from both of said couplers at one of said frequencies are substantially in phase and portions of energy from both of said couplers at the other of said frequencies are also in phase, the coupling means between said first and second hybrid couplers comprising respective ones of a pair of microwave transmission lines of electrical lengths which differ by an integral number of transmission line wave lengths at one of said frequencies and an odd integral number of transmission line half wavelengths at the other of said frequencies, and means along one of said transmission lines for substantially equalizing the attenuation provided by said transmission lines.

2. A microwave system as set forth in claim 1, wherein the shortest one of said pair of transmission lines includes adjustable attenuator means for substantially equalizing the attenuation provided between said couplers along both of said transmission lines.

3. A microwave system as set forth in claim 2, further including adjustable phase shifting means along one of said transmission lines for establishing said difference in electrical length for said pair of lines.

4. A microwave system as set forth in claim 1, wherein a local oscillator is coupled to one of the input terminals of the first of said hybrid couplers for supplying the microwave energy of said first frequency thereto, and a source of carrier frequency energy is coupled to the other input terminal of said first hybrid coupler for supplying the microwave energy of said second frequency thereto.

5. A microwave system, comprising first and second wave guide magic tee hybrid couplers each having a pair of main wave guide arms and a series and shunt arm coupled thereto for providing a hybrid junction, the series and shunt arms of said first coupler being terminated by input terminals, first and second microwave energy input means coupled to respective ones of the input terminals of said first coupler for supplying microwave energy of first and second different frequencies thereto, respectively, the series and shunt arms of said second coupler being terminated by output terminals coupled to impedance matched loads, one of said loads being a mixer device, first transmission line means of one electrical length between the end of one main wave guide arm of said first magic tee coupler and the end of one main wave guide arm of said second magic tee coupler, second transmission line means of a different electrical length than that of said first means between the end of the other main wave guide arm of said first magic tee coupler and the end of the other main wave guide arm of said second magic tee coupler, the difference in electrical lengths of said transmission lines means being an integral number of wavelengths at one of said frequencies and an odd integral number of half wavelengths at the other of said frequencies, said magic tee hybrid couplers and the transmission line means therebetween comprising means for supplying energy of said first and second frequencies to said mixer device whereat portions of energy from both of said couplers in response to energy of said first frequency from said first microwave energy input means are substantially in phase and portions of energy from both of said couplers in response to energy of said second frequency from said second microwave energy input means are also in phase, and microwave attenuator means along the shortest of said transmission line means for substantially equalizing the attenuation of microwave energy provided by said first and second transmission line means.

6. A microwave system as set forth in claim 5, further including an adjustable phase-shifter along one of said transmission line means for establishing said difference in electrical length between said first and second transmission line means.

7. A microwave system, comprising first and second wave guide hybrid ring couplers each having four terminals spaced from each other around each ring coupler by predetermined amounts, a pair of alternate terminals of said first ring coupler comprising first and second input terminals, first and second microwave energy input means coupled to respective ones of the input terminals of said first coupler for supplying microwave energy of first and second different frequencies thereto, respectively, a further pair of alternate terminals of said first ring coupler comprising first and second output terminals for said first coupler, a pair of alternate terminals of said second ring coupler comprising first and second input terminals for said second coupler, a further pair of alternate terminals of said second ring coupler comprising first and second output terminals for said second coupler, a mixer device coupled to one of the output terminals of said second coupler, first transmission line means coupling one of the output terminals of said first coupler with one of the input terminals of said second coupler, second transmission line means of different length coupling the other output terminal of said first coupler with the other input terminal of said second coupler, means for providing for a difference in the electrical lengths of said first and second transmission line means of substantially an integral number of transmission line wavelengths at one of said first and second frequencies and substantially an odd integral number of transmission line half wavelengths at the other of said first and second frequencies, said hybrid ring couplers and the transmission line means therebetween comprising means for supplying energy of said first and second frequencies to said mixer device whereat portions of energy from both of said couplers in response to energy of said first frequency from said first microwave energy input means are substantially in phase and portions of energy from both of said couplers in response to energy of said second frequency from said second microwave energy input means are also in phase, and means along the shortest of said transmission line means for substantially equalizing its attenuation with that provided by the longer of said transmission line means.

8. A microwave system as set forth in claim 7, further including an adjustable phase-shifter along one of said transmission line means.

9. A microwave system, comprising first and second hybrid wave guide directional couplers electrically joining first and second adjacent wave guides at spaced regions therealong, each of said first and second wave guides having an input terminal and an output terminal, first and second microwave energy input means coupled to respective ones of the input terminals of said first and second wave guides for supplying microwave energy of a first frequency and microwave energy of a second frequency thereto, respectively, a mixer device coupled to one of the output terminals of said first and second wave guides, the portion of said second wave guide between said couplers being longer than the portion of said first wave guide between said couplers, means along one of said portions of wave guide for providing for a difference in the electrical spacing between said hybrid couplers along said first and second wave guides of an integral number of guide wavelengths at a first frequency and an odd integral number of guide half wavelengths at a second frequency, said wave guide directional couplers and said portions of said first and second wave guides therebetween comprising means for supplying energy of said first and second frequencies to said mixer device whereat portions of energy from both of said couplers in response to energy of said first frequency from said first microwave energy input means are substantially in phase and portions of energy from both of said couplers in response to energy of said second frequency from said second microwave energy input means are also in phase, and means along the portion of said first wave guide between said couplers for substantially equalizing the attenuation of said portion with that of the portion of said second wave guide between said couplers.

10. A microwave mixer system, comprising first and second four-terminal hybrid couplers, means coupled to first and second terminals of said first hybrid coupler, respectively, for supplying local oscillator and carrier wave energy at different frequencies $F_1$ and $F_2$, respectively, first microwave transmission line means of a first length coupling the third terminal of said first hybrid coupler to the first terminal of said second hybrid coupler, second microwave transmission line means of different electrical length coupling the fourth terminal of said first hybrid coupler to the second terminal of said second hybrid coupler, said first and second transmission line means being adapted to provide substantially equal attenuation of microwave energy, means including a mixer coupled to the third terminal of said second hybrid coupler, and means including a substantially reflectionless termination coupled to the fourth terminal of said second hybrid coupler, said first and second transmission line means being adapted to differ in electrical length by an integral number of guide wavelengths at one of said frequencies and by an odd number of guide half wavelengths at the other of said frequencies so that energy of both frequencies $F_1$ and $F_2$ at the first and second terminals of said second hybrid coupler has a proper phase relationship for transfer to the third terminal of said second hybrid coupler and thus to said mixer in an in-phase condition for the frequency $F_1$ and in an in-phase condition for the frequency $F_2$.

11. A microwave mixer system as set forth in claim 10, wherein said first and second transmission line means differ in physical length by:

$$\Delta l=\frac{C}{2\Delta F}\left[1-\left(\frac{\bar{\lambda}}{\lambda_c}\right)^2\right]^{1/2}$$

where C is the velocity of light in free space, $\Delta F$=the difference between the frequencies $F_1$ and $F_2$, $\bar{\lambda}$ is substantially the mean free space wavelength of the frequencies $F_1$ and $F_2$, and $\lambda_c$ is the cutoff wavelength of the hollow wave guides.

12. A microwave mixer system as set forth in claim 11, wherein said first and second couplers comprise rectangular wave guide hybrid directional couplers each comprising first and second adjacent wave guide sections having a coupling slot in a common narrow wall for said wave guide sections.

References Cited in the file of this patent

UNITED STATES PATENTS

| | | |
|---|---|---|
| 2,436,828 | Ring | Mar. 2, 1948 |
| 2,569,129 | Kamm | Sept. 25, 1951 |
| 2,605,400 | McClain | July 29, 1952 |
| 2,702,371 | Sunstein | Feb. 15, 1955 |

UNITED STATES PATENT OFFICE
Certificate of Correction

Patent No. 2,850,626 September 2, 1958

Kiyo Tomiyasu

It is hereby certified that error appears in the printed specification of the above numbered patent requiring correction and that the said Letters Patent should read as corrected below.

Column 1, line 24, for "spacer" read —spaced—; column 3, line 15, for "couple" read —coupler—; column 5, line 49, for "reduciing" read —reducing—; line 70, strike out the dash over "$\lambda_c$"; column 9, line 5, for "excited" read —excite—.

Signed and sealed this 14th day of April 1959.

[SEAL]

Attest:
KARL H. AXLINE,
*Attesting Officer.*

ROBERT C. WATSON,
*Commissioner of Patents.*